US006922338B2

United States Patent
Poechmueller

(10) Patent No.: US 6,922,338 B2
(45) Date of Patent: Jul. 26, 2005

(54) MEMORY MODULE WITH A HEAT DISSIPATION MEANS

(75) Inventor: Peter Poechmueller, Unterhaching (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/682,649

(22) Filed: Oct. 9, 2003

(65) Prior Publication Data
US 2004/0071035 A1 Apr. 15, 2004

(30) Foreign Application Priority Data

Oct. 9, 2002 (DE) .......................................... 102 47 035

(51) Int. Cl.⁷ ............................................... H05K 7/20
(52) U.S. Cl. ...................... 361/719; 361/704; 361/707; 257/712; 165/80.3
(58) Field of Search ................................ 361/690, 704, 361/707–711, 715, 719–721; 257/706, 712; 174/50.52, 50.54, 52.2, 52.4; 165/80.2, 80.3, 185

(56) References Cited

U.S. PATENT DOCUMENTS

| 6,154,364 | A  | * | 11/2000 | Girrens et al. | ............... 361/704 |
| 6,188,576 | B1 | * | 2/2001 | Ali et al. | ..................... 361/704 |
| 6,201,695 | B1 | * | 3/2001 | Duesman et al. | ........... 361/703 |
| 6,212,076 | B1 | | 4/2001 | MacQuarrie et al. | |
| 6,233,150 | B1 | * | 5/2001 | Lin et al. | ..................... 361/704 |
| 6,441,312 | B1 | * | 8/2002 | Tanimura et al. | ........... 174/252 |
| 6,477,054 | B1 | * | 11/2002 | Hagerup | ..................... 361/720 |

FOREIGN PATENT DOCUMENTS

| DE | 41 18 397 A1 | 12/1992 | |
| DE | 197 40 946 A1 | 11/1998 | |
| DE | 100 33 352 A1 | 1/2002 | |
| JP | 02284452 A | * 11/1990 | ........... H01L/23/40 |

* cited by examiner

Primary Examiner—Boris Chervinsky
(74) Attorney, Agent, or Firm—Laurence A. Greenberg; Werner H. Stemer; Ralph E. Locher

(57) ABSTRACT

A memory module includes a board, a memory device attached to the board, and a heat dissipation means arranged between the memory device and the board.

9 Claims, 3 Drawing Sheets

PRIOR ART

MEMORY MODULE WITH A HEAT DISSIPATION MEANS

BACKGROUND OF THE INVENTION

1. Field of the Invention

The present invention relates to a memory module and in particular to a memory module with a heat dissipation means for the reduction of the temperature of memory devices of the memory module.

2. Description of the Related Art

A substantial parameter with DRAM (Dynamic Random Access Memory) memory devices is the retention time during which each memory cell of the memory device maintains information stored therein in form of an electrical charge in a securely readable manner. The longer the retention time, the lower the electric power required for refreshing the memory cells on a temporal average. Particularly for battery-operated applications, such as for mobile radio applications, a power need as low as possible is desired. Usually a retention time of about 64 ms is required. The retention time is determined by the electrostatic capacity of a capacitor which every single memory cell has and various parasitic leakage currents via which the capacitor looses its charge. The progressive miniaturization and the growing integration density of DRAM memory devices require increasingly smaller circuit geometries. Due to the increasingly smaller circuit geometries, it becomes more and more difficult to manufacture DRAM memory devices. In particular, ever-increasing expenditure is required to implement the capacity of about 20 fF to 40 fF of the capacitor of each single memory cell. Hereby, especially the yield of those memory devices whose entire memory cells meet the requirement for the retention time decreases in the manufacturing process.

The leakage currents causing the gradual loss of the memory cell charge are temperature-dependent. The higher the semiconductor temperature or the temperature of the semiconductor material of the memory device, the higher the leakage currents. A temperature difference of about 2° C. to 3° C. already causes a change in the retention time of 10 ms to 15 ms.

Most of the memory devices manufactured today are sold in form of memory modules or memory groups. A memory module has a board onto which usually a plurality of memory devices is soldered.

FIG. 3 shows an example for a conventional memory module with a board 10 onto the front on which four single memory devices 12 are mounted. The memory module is connected in an electrically conductive manner via a contact bar 14 or a linear arrangement of contact pins or contact pads to an application, such as a motherboard of a computer system. The memory module is usually plugged in a corresponding socket which is arranged on a motherboard of a computer, for example. During the operation, heat or waste heat develops in the memory devices 12. It is given off or dissipated either by direct emission or convection to the environment or by the electrical contacts 16 to the memory module board 10. The dissipation of the waste heat via the electrical contacts is the mostly dominating heat dissipation mechanism today. This is especially the case for the memory devices 12 in TSOP (thin small outline device) housings.

SUMMARY OF THE INVENTION

It is the object to provide an improved memory module or a memory module with an improved retention time.

According to the present invention, a memory module includes a board, a memory device which is attached to the board, and a heat dissipation means which is arranged between the memory device and the board.

The present invention is based on the finding that by reduction of the temperature requirements or the operating temperature of a memory device of a memory module, at which it can be correctly operated, a yield in the manufacturing process is substantially increased. Furthermore, the present invention is based on the finding that the operating temperature of a memory device on a memory module is decreased by dissipating waste heat developing in operation from the memory device to the board of the memory module.

One advantage of the present invention is that, by the heat dissipation means provided, the temperature of the memory device is reduced, and thus the retention times of memory cells of the memory device are extended. By lowered requirements for the operating temperature at which a memory device operates correctly and, in particular, has sufficient retention times, the yield in the manufacturing process of the memory device increases. Another advantage of the present invention is that by the arrangement of the heat dissipation means between the memory device and the board the manufacturing expenses and, in particular, expenses and costs of the loading of the board with the memory device are not or not substantially increased over a conventional module. Furthermore, compactness of the memory module is retained by this arrangement of the heat dissipation means.

According to another aspect of the present invention, a memory module includes a board, a memory device which is attached to the board, and a frame which is attached to the board for the dissipation of heat from the board.

BRIEF DESCRIPTION OF THE DRAWINGS

Subsequently, preferred embodiments of the present invention will be explained in more detail with reference to the accompanying Figures, in which.

DESCRIPTION OF THE PREFERRED EMBODIMENTS

Figure 1:
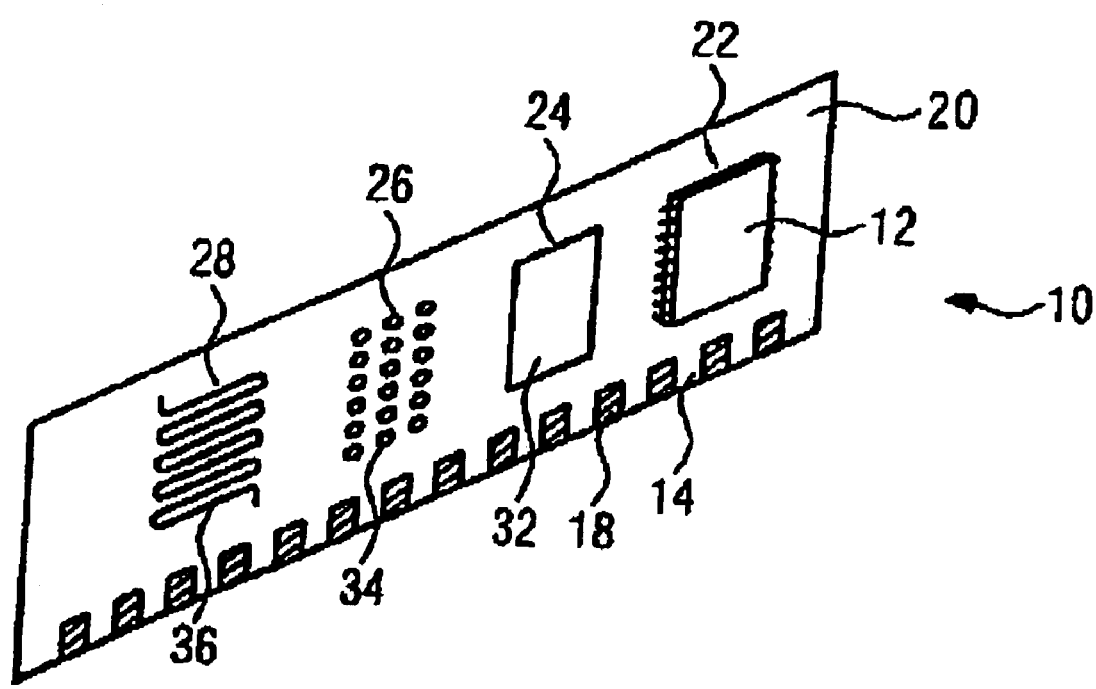
FIG. 1 is a schematic representation of a memory module with features of various embodiments of the present invention.
Figure 2:
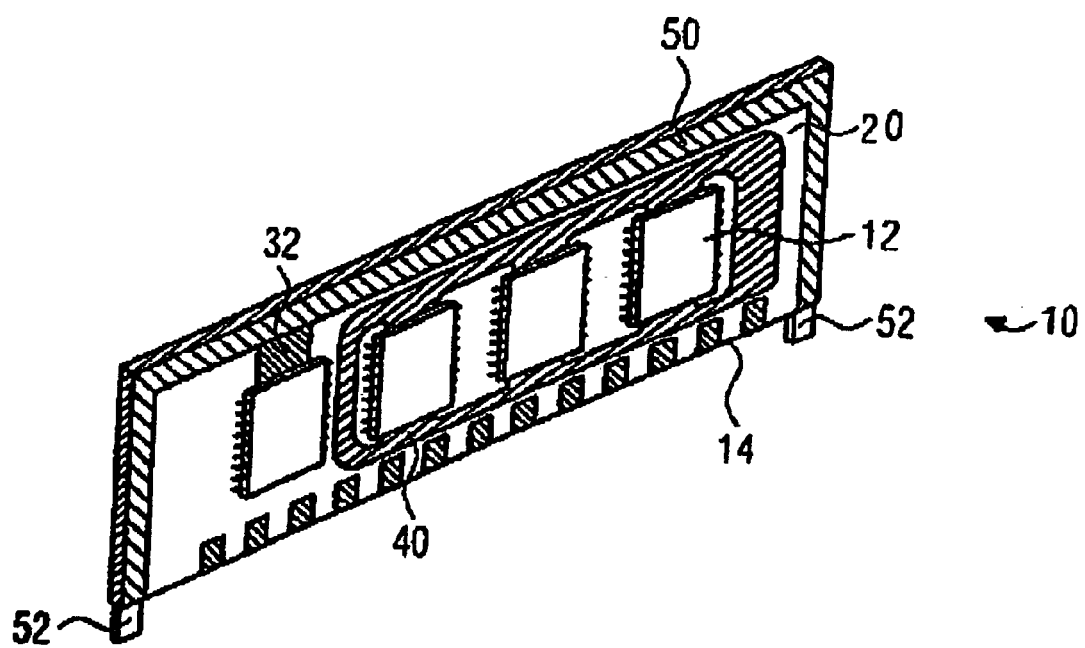
FIG. 2 is a schematic representation of a memory module with features of various embodiments of the present invention.
Figure 3:
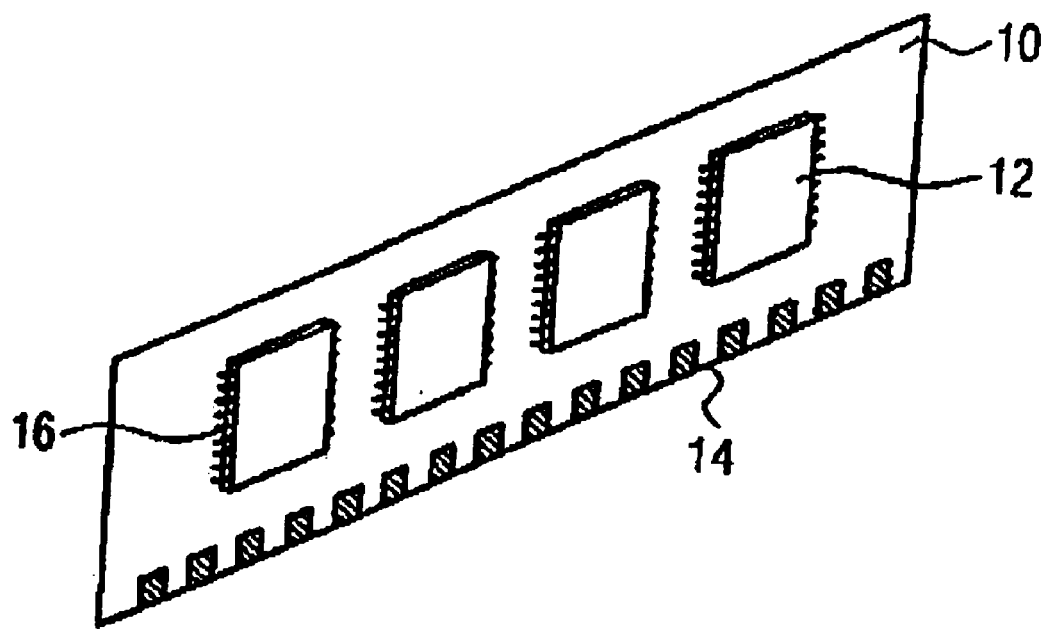
FIG. 3 is a schematic representation of a conventional memory module.

FIGS. 1 to 3 are schematic representations of memory modules, each having a board 10 on whose illustrated surface 20 several memory devices 12 are attached. The board 10 comprises a contact bar 14 with multiple contact pads 18 via which it may be connected, for example, to a motherboard of a computer. In FIGS. 1 to 3, traces and, if necessary, integrated circuits are not illustrated, via which the memory devices 12 or electrical contacts 16 thereof are connected to a contact bar 14. In FIGS. 1 and 2 features of several embodiments of the present invention are illustrated at the same time, respectively, which can be combined with each other in the illustrated or another manner, and alternatively can be individually deployed independently of each other.

Board 10 illustrated in FIG. 1 has a plurality of loading locations 22, 24, 26, 28 on the illustrated surface 20. At a first loading location 22, the board 10 is loaded with a memory device 12. A thin planar gap, which is not illustrated, between the board 10 and the memory device 12 is filled by a heat-conducting paste. This forms a highly heat-conductive connection between the memory device 12 and the board 10, and thus enables an efficient dissipation of heat towards the board 10, which, when the memory device 12 is operated, is generated therein.

Apart from soldering points, which are not illustrated, for making the electrical contacts 16 to memory devices 12, and apart from the contact pads 18 of the contact bar 14, the board 10 is preferably completely surrounded by a layer of solder varnish. This represents an isolation layer having an approximately infinitesimal electrical conductivity and usually a bad thermal conductivity. Alternatively or additionally to the attachment of a heat-conducting paste between the board 10 and the memory device 12, in one area of the board 10 bordering on the memory device 12 the solder varnish is removed. In particular, using the heat-conducting paste, but also without one, this makes sense to increase the heat transfer from the memory device 12 to the board 10.

At a second loading location 24, a metal area 32 is arranged as a further alternative or feature that can be combined for improvement of the heat transfer. The metal area 32 preferably covers an as great as possible percentage of the surface of the board 10, which is covered with a memory device 12 after the complete loading of the board 10. Since metal has a good thermal conductivity, the metal area 32 enhances the thermal transfer between the memory device 12 and the board 10.

A third loading location 26 is provided with a plurality of contact holes 34. These are metallized and preferably filled with soldering tin or another metal. Preferably, the contact holes 34 extend from the illustrated surface of the board 10 to an opposing surface that is not illustrated. Due to the good thermal conductivity of the metal they contain, the contact holes 34 cause a dissipation of heat from a memory device 12 arranged at the third loading location 26 towards the opposing surface of the board 10 which is not illustrated.

A fourth loading location 28 is provided with a conductive trace 36 with as large an area as possible, which preferably covers that part of the board 10 in a meander-shaped manner which is covered with a memory device 12 after a complete loading.

The metal area 32, the contact holes 34, and the conductive trace 36 each make use of the metal(s) they comprise having a good to very good thermal conductivity. Preferably, the heat dissipation is respectively further improved by connecting the metal area 32, the contact holes 34, and the conductive trace 36, respectively, to further traces which are not illustrated. Preferably, they are connected to traces carrying supply potentials. These traces usually have especially large cross-sections, extend across the whole board 10, and are therefore especially suited to dissipate heat away from the memory devices 12.

The metal area 32, the contact holes 34, and the conductive trace 36 can be combined with each other. For example, the metal area 32 is connected via contact holes 34 to a further metal area or a further trace on the opposing side of the board 10, which is not illustrated, for the large-area reception of waste heat of a memory device 12. The waste heat is dissipated via the contact holes 34 to the other side of the board 10, and is there given off, for example, to the atmosphere via the further metal area or the further trace.

In FIG. 2, further measures are illustrated which can be used, individually or in combination with each other or with the measures illustrated on the basis of FIG. 1, to enhance the heat dissipation from the memory devices 12.

A cooling-plate 40 or heat sink is arranged below one or more memory devices 12. The cooling-plate 40 receives waste heat from the memory devices 12 and passes it into the board 10 in a large-area manner. Furthermore, it dissipates part of the waste heat to the surrounding atmosphere. The use of the cooling plate 40 is especially advantageous when a mounting technique is employed which does not require soldering the memory devices 12 to the board 10. Such a mounting technique is, for example, the pressing of the memory devices 12 on the board 10 by means of microneedles. The cooling plate 40 is preferably a mechanically independent device. Alternatively, it is a metallization which is formed on the board 10 like the metal area 32 from FIG. 1 in a similar or the same manner as and preferably at the same time with traces.

A frame 50 is arranged at the edge of the board 10 and comprises a metal or another very well heat-conductive material. Preferably, the frame 50 comprises taps 52 which are heat-conductively connected to the motherboard or the socket when connecting the memory module to a motherboard or a socket thereon, to dissipate waste heat to the motherboard or the socket. For example, the frame 50 comprises a simple wire, a trace preferably thickened or strengthened by soldering tin, or another metal trace on the board 10.

The frame 50 improves the heat dissipation from the board 10 and thus reduces the temperature of the board 10. Thereby, it improves the heat transfer from the memory devices 12 to the board 10.

The frame 50 can further be combined with the measures illustrated in FIGS. 1 and 2. For example, the metal area 32 which is also illustrated in FIG. 1 is preferably extended or led out under the memory device 12 to contact the frame 50, and to be directly heat-conductively connected thereto.

A combination of the cooling plate 40 with frame 50 is also advantageous. The cooling plate 40 receives waste heat from the memory devices 12, and passes them into the board 10 in a large-area manner. The frame 50 receives the waste heat from the board 10 and dissipates it to the motherboard. This is particularly effective if the distance between the cooling plate 40 and the frame 50 is small, and they are opposing each other along an as large as possible part of the frame 50.

All measures described are advantageously applicable to memory modules of any desired kind, shape, size, and loading.

Although above preferred embodiments have been described in which individual measures have been described with a dissipation frame 50 in combination, the present invention is not limited hereto. In fact, only the dissipation frame 50 without any further measure for heat dissipation may also be inventively provided.

What is claimed is:

1. A memory module comprising;
   a board having an upper surface and an edge;
   a memory device attached to said board, said memory device having a lower surface;
   a heat dissipation means arranged in a gap between said lower surface of said memory device and said upper surface of said board,
   said heat dissipation means including an area of said board at which solder varnish covering said board is removed; and said memory device being disposed above said area and a frame arranged at said edge of said board and including a heat-conductive material, said frame including taps for heat-conductively connecting to a socket or a motherboard.

2. The memory module of claim 1, wherein said heat dissipation means includes a heat-conducting paste between said board and said memory device.

3. A memory module, comprising:

a board having an upper surface and an edge;

a memory device attached to said board, said memory device having a lower surface;

a heat dissipation means arranged in a gap between said lower surface of said memory device and said upper surface of said board, said heat dissipation means including a metal layer, said metal layer being connected to a conductive trace and a frame arranged at said edge of said board and including a heat-conductive material, said frame including taps for heat-conductively connecting to a socket or a motherboard.

4. The memory module of claim 3, wherein said conductive trace is a supply line to which, in operation, a supply potential is applied.

5. The memory module of claim 3, wherein said conductive trace is meander-shaped.

6. The memory module of claim 3, wherein said metal layer includes a heat sink.

7. The memory module of claim 2, wherein said heat dissipation means includes a contact hole.

8. The memory module of claim 7, wherein said contact hole is connected to a supply line at which, in operation, a supply potential is applied.

9. A memory module, comprising:

a board having an edge;

a memory device attached to said board;

a heat dissipation means arranged between said memory device and said board;

a frame arranged at said edge of said beard and including a heat-conductive material; and said frame including taps for heat-conductively connecting to a socket or a motherboard.

\* \* \* \* \*